US011259133B2

(12) United States Patent
Talag et al.

(10) Patent No.: US 11,259,133 B2
(45) Date of Patent: Feb. 22, 2022

(54) SINGLE LINE AXIS SOLDER DISPENSE PROCESS FOR A MEMS DEVICE

(71) Applicant: Knowles Electronics, LLC, Itasca, IL (US)

(72) Inventors: Norman Dennis Talag, Woodridge, IL (US); Anthony Schmitz, Naperville, IL (US)

(73) Assignee: Knowles Electronics, LLC, Itasca, IL (US)

( * ) Notice: Subject to any disclaimer, the term of this patent is extended or adjusted under 35 U.S.C. 154(b) by 5 days.

(21) Appl. No.: 17/017,120

(22) Filed: Sep. 10, 2020

(65) Prior Publication Data
US 2021/0076149 A1   Mar. 11, 2021

Related U.S. Application Data

(60) Provisional application No. 62/898,355, filed on Sep. 10, 2019.

(51) Int. Cl.
*H04R 31/00* (2006.01)
*B81B 7/00* (2006.01)
*B23K 1/00* (2006.01)

(52) U.S. Cl.
CPC ........... *H04R 31/006* (2013.01); *B81B 7/008* (2013.01); *B81B 7/0051* (2013.01); *B23K 1/0008* (2013.01); *B81B 2201/0257* (2013.01); *H04R 2201/003* (2013.01)

(58) Field of Classification Search
CPC .............. B81C 1/0023; B81C 1/00269; B81C 2203/019; B81B 7/007; B81B 2201/0257; B81B 2207/095; B81B 2207/096; H04R 19/005; H04R 19/016; H04R 31/006; H04R 2201/003
See application file for complete search history.

(56) References Cited

U.S. PATENT DOCUMENTS

| 10,227,232 B2 * | 3/2019 | Lim ..................... H04R 19/016 |
| 10,314,171 B1 * | 6/2019 | Aleksov ................ H01L 23/585 |
| 10,640,371 B2 * | 5/2020 | Lim ....................... B81C 1/0023 |
| 11,142,451 B2 * | 10/2021 | Furst .................... G01L 19/143 |
| 2003/0227094 A1 * | 12/2003 | Chou ................ H01L 23/49827 257/778 |
| 2008/0175425 A1 * | 7/2008 | Roberts ................ H04R 19/005 381/361 |
| 2009/0151972 A1 * | 6/2009 | Potter .................... H01L 21/50 174/50.5 |
| 2012/0266684 A1 * | 10/2012 | Hooper ............... G01L 19/0672 73/721 |

(Continued)

*Primary Examiner* — Matthew A Eason
(74) *Attorney, Agent, or Firm* — Loppnow & Chapa

(57) ABSTRACT

A microphone assembly includes a substrate defining a port, a MEMS transducer, a guard ring, and a can. The MEMS transducer is coupled to the substrate such that the MEMS transducer is positioned over the port. The guard ring is coupled to the substrate and surrounds the MEMS transducer. The guard ring includes a plurality of edges that further includes a first edge and an opposing second edge. A portion of the first edge and a portion of the second edge have a reduced thickness relative to adjacent ones of the plurality of edges. The can is coupled to the guard ring such that the substrate and the can cooperatively define an interior cavity.

20 Claims, 14 Drawing Sheets

(56) References Cited

U.S. PATENT DOCUMENTS

| | | | |
|---|---|---|---|
| 2013/0249109 A1* | 9/2013 | Ma | H01L 23/481 |
| | | | 257/774 |
| 2015/0166335 A1* | 6/2015 | Loeppert | H01L 21/56 |
| | | | 438/51 |
| 2017/0006368 A1* | 1/2017 | Brioschi | H04R 31/006 |
| 2017/0084521 A1* | 3/2017 | Chang | H01L 24/84 |
| 2017/0374441 A1* | 12/2017 | Hoekstra | B81C 1/00309 |
| 2018/0029880 A1 | 2/2018 | Lim et al. | |
| 2019/0345026 A1* | 11/2019 | Furst, II | B81B 7/008 |

* cited by examiner

SINGLE LINE AXIS SOLDER DISPENSE PROCESS FOR A MEMS DEVICE

FIELD OF THE DISCLOSURE

The present disclosure relates to microelectromechanical systems (MEMS) devices, and in particular, to the manufacture of MEMS devices that include MEMS transducers.

BACKGROUND

Compact components are desirable when building high-performance, high-density devices such as mobile communication devices, portable music players, and other portable electronic devices. One solution for providing high quality, compact devices is to use microelectromechanical systems (MEMS).

For example, microphone assemblies for many portable electronic devices include MEMS acoustic transducers, which convert acoustic energy into an electrical signal. The MEMS acoustic transducer includes a silicon die that is mounted onto a printed circuit board (PCB) to form the microphone assembly. Although the silicon die is small, existing manufacturing processes for these microphone assemblies are limited in terms of the overall size of the silicon die that can be accommodated within a given microphone package.

SUMMARY

A first aspect of the present disclosure relates to a microphone assembly. The microphone assembly includes a substrate defining a port, a MEMS transducer, a guard ring, and a can. The MEMS transducer is coupled to the substrate such that the MEMS transducer is positioned over the port. The guard ring is coupled to the substrate and surrounds the MEMS transducer. The guard ring includes a plurality of edges that further includes a first edge and an opposing second edge. A portion of the first edge and a portion of the second edge have a reduced thickness relative to adjacent ones of the plurality of edges. The can is coupled to the guard ring such that the substrate and the can cooperatively define an interior cavity.

A second aspect of the present disclosure relates to a populated printed-circuit-board. The populated printed-circuit-board includes a substrate and a plurality of guard rings. The plurality of guard rings are coupled to the substrate. Each of the plurality of guard rings includes a plurality of edges. A first edge of the plurality of edges and an opposing second edge of the plurality of edges have a reduced thickness relative to adjacent ones of the plurality of edges.

A third aspect of the present disclosure is a method. The method includes providing a substrate defining a plurality of ports. The method also includes coupling a plurality of guard rings to the substrate such that each of the plurality of guard rings is positioned to surround a respective one of the plurality of ports. The method further includes coupling a plurality of MEMS transducers to the substrate, where each of the plurality of MEMS transducers is positioned within a periphery of a respective one of the plurality of guard rings and at least partially isolates a respective one of the plurality of ports. The method additionally includes applying a solder along a single axis between each of the plurality of guard rings such that the solder is applied approximately equally to adjacent ones of the plurality of guard rings. The method also includes coupling a plurality of cans to the plurality of guard rings to form a plurality of coupled microphone assemblies in which each of the plurality of cans is configured to enclose a respective one of the plurality of MEMS transducers. The method further includes separating each of the plurality of coupled microphone assemblies from the substrate to form a plurality of individual microphone assemblies.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

Figure 1:
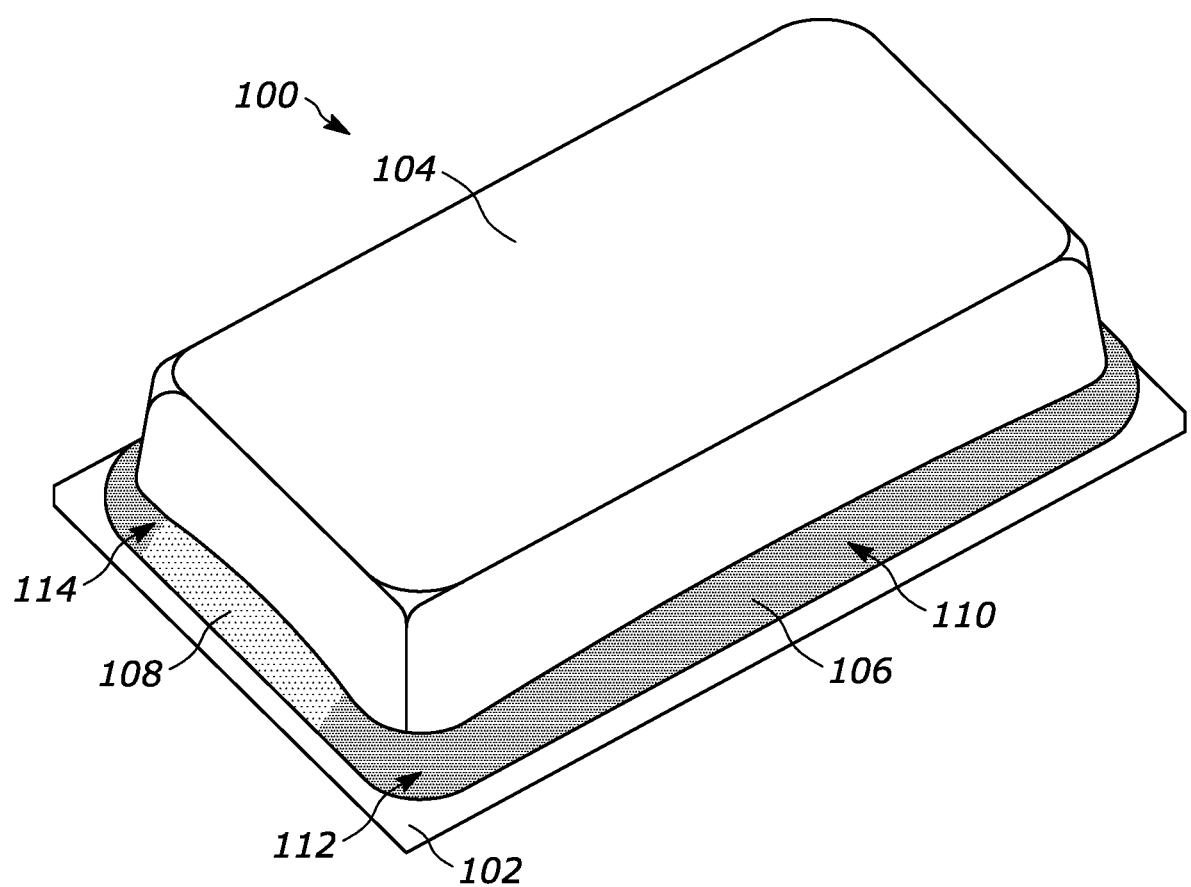
FIG. 1 is a perspective view of a microphone assembly, according to an illustrative embodiment.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

In general, disclosed herein is a microphone assembly that is produced using a single line axis solder dispensing process. The microphone assembly includes a MEMS acoustic transducer, an integrated circuit, a substrate, and a can. The MEMS acoustic transducer may be a capacitive acoustic transducer including a stationary back plate and a movable diaphragm, which are configured to convert acoustic energy incident on the diaphragm into an electrical signal. The MEMS acoustic transducer and the integrated circuit are coupled to the substrate. An electrically conductive guard ring is also coupled to the substrate and surrounds the MEMS transducer and the integrated circuit. The can is coupled to the guard ring by solder to at least partially acoustically and electrically isolate the MEMS acoustic transducer from an environment surrounding the microphone assembly. Traditionally, the solder is applied to the guard ring by a dispensing needle in a picture frame pattern that extends along the entire guard ring (e.g., along an entire perimeter of the can and microphone assembly, along two axes, etc.). The solder dispensing process requires the needle to have a minimum clearance away from the MEMS transducer to avoid solder contamination (e.g., wetting) of the surfaces of the MEMS transducer and/or damage to the MEMS transducer due to contact from the needle. This clearance requirement, between the needle and the MEMS transducer, limits the minimum size of the microphone assembly package that can be achieved for the MEMS transducer.

The embodiments disclosed herein can reduce the overall size of the microphone assembly that can be achieved for a MEMS transducer of fixed dimensions, without altering the size of the dispensing needle. In particular, microphone assemblies disclosed herein are produced by dispensing the solder along only two sides of the guard ring. In other words, the can for the microphone assembly is coupled to the guard ring by solder that extends along an entire length of only two sides of the can. A tag of epoxy or another adhesive product is applied to the remaining sides of the can to maintain an air-tight seal between the MEMS transducer and an environment surrounding the microphone assembly.

During production, a plurality of microphone assemblies may be formed onto a single substrate to form a populated PCB. As used herein, the term "coupled microphone assembly" refers to a microphone assembly that is connected to other microphone assemblies on the populated PCB. The coupled microphone assemblies may be arranged in rows along a length of the PCB. The coupled microphone assemblies may be aligned in both an X-axis direction and a Y-axis direction forming aligned rows and columns of coupled microphone assemblies. To prepare the coupled microphone assemblies for placement of the cans, the solder is dispensed along a single axis between the guard rings for each one of the coupled microphone assemblies. More specifically, the solder is dispensed along the single axis extending parallel to a longest edge of each one of the guard rings (e.g., the X-axis).

Among other benefits, the single axis solder dispensing process allows for an increase in the overall size (e.g., footprint) of the silicon die that is used within a microphone assembly without increasing the overall package size of the microphone assembly. The details of the general depiction provided above will be more fully explained by reference to FIGS. 1-17.

FIG. 1 shows an individual microphone assembly, shown as assembly 100, according to an illustrative embodiment. The assembly 100 includes a substrate 102; and a cap, cover, or lid, shown as can 104 coupled to the substrate. The can 104 defines a continuous surface that is sized to surround and enclose all of the internal components of the assembly 100. In the embodiment of FIG. 1, the can 104 is made from a metal material (e.g., aluminum, titanium, steel, etc.). The can 104 is coupled to the substrate along a perimeter of the can 104 using solder 106 (e.g., a re-meltable conductive metal alloy, lead free solder, etc.) and an adhesive or sealant (e.g., an epoxy, etc.), shown as tag 108. The solder 106 electrically connects the can 104 to conductive material that is embedded within or otherwise coupled to the substrate 102. Additionally, the solder 106 at least partially acoustically isolates electrical components contained within the can 104 from an environment surrounding the microphone assembly 100.

Figure 3:
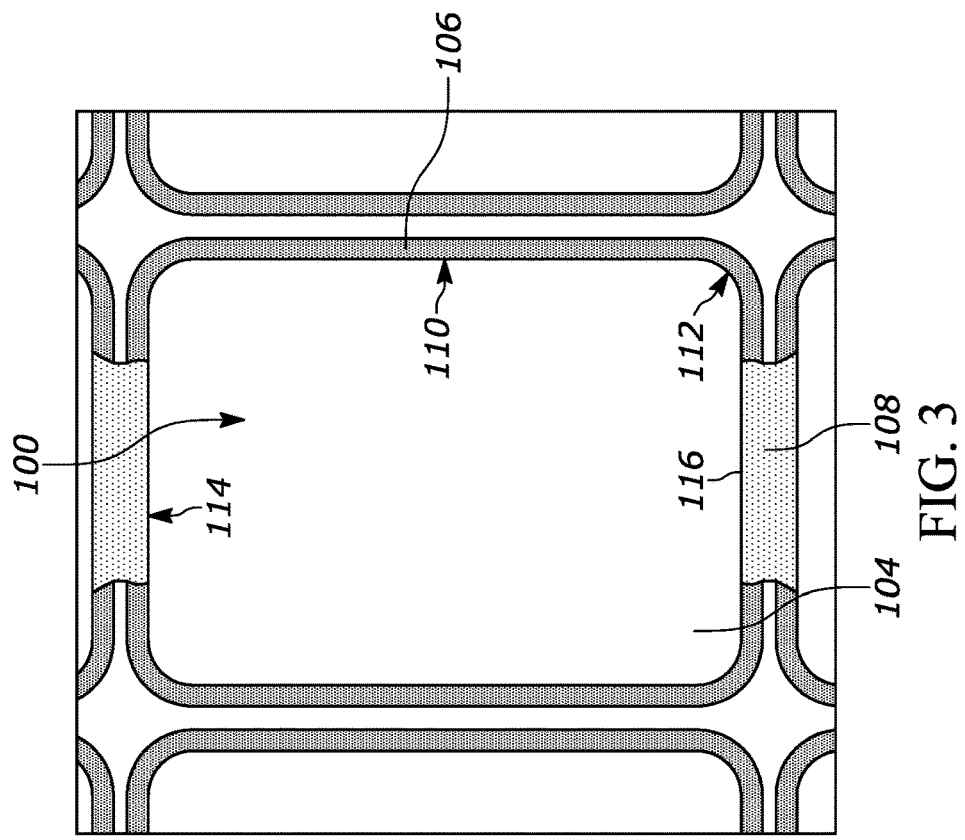
FIG. 3 is a top view of a microphone assembly on a populated PCB, according to another illustrative embodiment.
Figure 2:
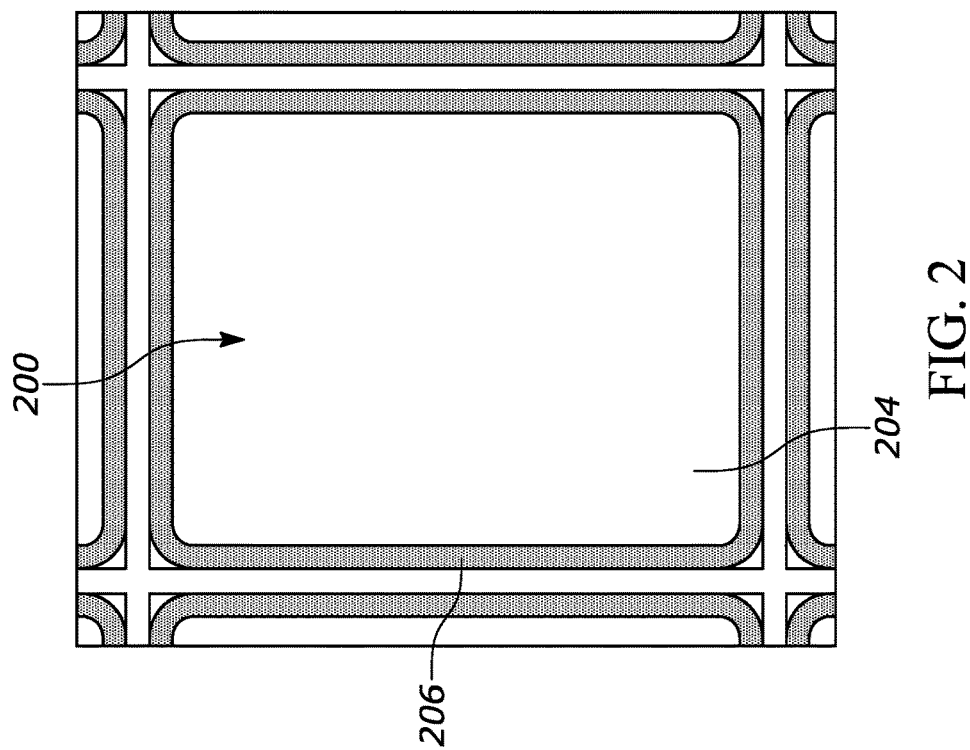
FIG. 2 is a top view of a microphone assembly on a populated printed-circuit-board (PCB), according to another illustrative embodiment.

During production, a plurality of microphone assemblies may be formed on (e.g., populated) or otherwise coupled to a single substrate (e.g., a substrate blank, etc.). The substrate may be a printed-circuit-board (PCB) that includes printed circuit traces or pads to facilitate electrical connections between components of each one of the microphone assemblies. FIG. 2 shows a top view of a coupled microphone assembly, shown as full frame assembly 200 that is produced using a dual axis solder dispense process (e.g., a conventional solder dispensing process). The full frame assembly 200 is shown before separation from a larger, populated PCB (e.g., a PCB that includes multiple, interconnected/coupled full frame assemblies 200). FIG. 3 shows a top view of the assembly 100 of FIG. 1, which is made using the single-axis dispensing process.

As shown in FIG. 2, the full frame assembly 200 includes solder 206 that extends along an entire (e.g., full) perimeter of the can 204. A thickness of the solder 206 is approximately uniform along the perimeter of the can 204. In contrast, for the assembly 100 of FIGS. 1 and 3, the solder 106 extends along an entire length of only two sides of the can 104. More specifically, the solder 106 extends along an entire length of the two longest sides 110 of the can 104. Additionally, the solder 106 wraps around each one of a plurality of corner regions 112 of the can 104, which connect the longest sides 110 with short sides 114 that are arranged in substantially perpendicular orientation relative to the longest sides 110.

As shown in FIGS. 1 and 3, a tag 108 is applied to each of the short sides 114 of the can 104, between the can 104 and the substrate 102. More specifically, the tags 108 are applied at a central position 116 along the short sides 114, approximately half-way between the corner regions 112 bounding the ends of the short sides 114. The tags 108 fill any gaps in solder 106 coverage along the perimeter of the can 104 to ensure an air-tight seal along the entire perimeter of the can 104. In some embodiments, the tag 108 includes a material with a higher melting point than the solder 106. In some embodiments, the tag 108 is and/or includes an epoxy. The epoxy may include a non-conductive epoxy (e.g., a resin-based alumina-filled epoxy, a resin-based silica-filled epoxy, etc.) and/or a conductive epoxy (e.g., a resin-based silver-filled epoxy, a resin-based nickel-filled epoxy, etc.). In other embodiments, the tag 108 includes another thermoplastic, polymide, adhesive, etc.

The size of the tag 108 and/or number of tags 108 used on each of the short sides 114 varies depending on the length of the short sides 114, the amount of solder 106 used on the longest sides 110 and the peak time and temperature that the assembly 100 is exposed to during the solder reflow operation. In the embodiment of FIGS. 1 and 3, the width of the assembly 100 is approximately 2.5 mm and after the reflow operation (as will be further described) the solder 106 covers approximately 1 mm on either side of the tag 108. A single tag 108 in the embodiment of FIGS. 1 and 3 covers a distance of approximately 600 microns. Thus, only a single tag 108 is required to ensure an air-tight seal between the can 104 and the substrate 102 in FIGS. 1 and 3. In other embodiments, the number of tags 108 and/or the quantity of adhesive or sealant applied with each tag 108 may be different.

Figure 4:
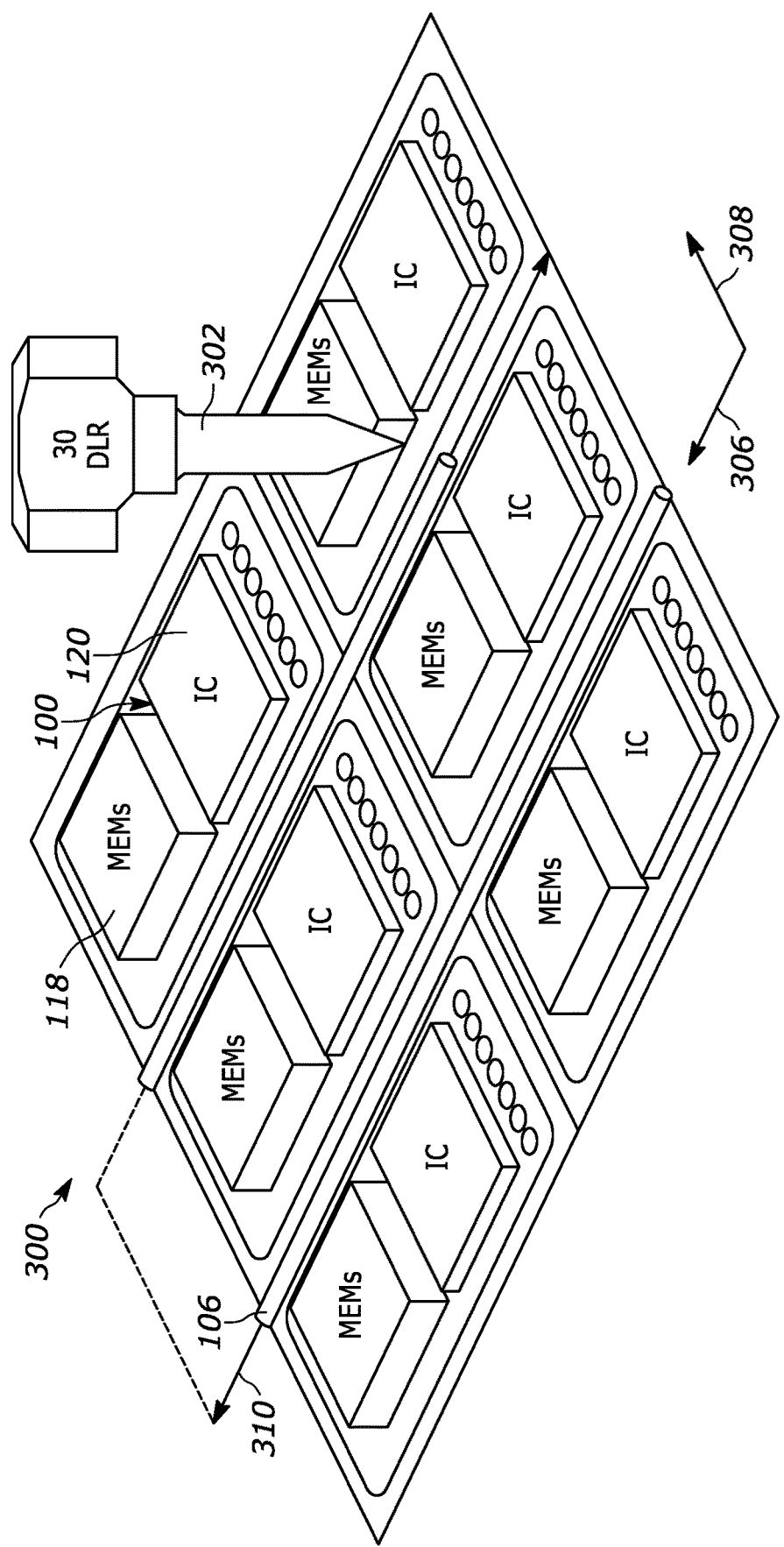
FIG. 4 is a perspective view of a populated PCB and solder dispensing needle, according to an illustrative embodiment.

FIG. 4 shows a top perspective view of a populated PCB 300 during a dispensing operation in which solder 106 is applied to the coupled microphone assemblies 100 by a dispensing needle 302 (e.g., before cans 104 are placed over each of the assemblies 100). The flow rate of solder 106 passing through the dispensing needle 302 is approximately constant throughout the dispensing operation. Each of the assemblies 100 shown in FIG. 4 includes a MEMS acoustic transducer, shown as MEMS transducer 118; and an integrated circuit 120. The MEMS transducer 118 is configured to convert acoustic energy into an electrical signal. The MEMS transducer 118 may include a movable diaphragm and a perforated back plate. Sound energy (e.g., sound waves, acoustic disturbances, etc.) incident on the diaphragm causes the diaphragm to move toward or away from the back plate. The change in distance results in a corresponding change in capacitance between conductive materials disposed on or within the diaphragm and the back plate. An electrical signal representative of the change in capacitance may be generated and transmitted to other portions of the microphone assembly, such as the integrated circuit, for processing. The integrated circuit may be an application specific integrated circuit (ASIC) or another type of semiconductor die integrating various analog, analog-to-digital, and/or digital circuits. In other embodiments, the MEMS transducer 118 may be another type of MEMS device now known or hereafter devised. For example, the MEMS transducer 118 may be a non-capacitive type MEMS device such as a piezoelectric transducer, a piezoresistive transducer, an optical transducer, etc.

The assemblies 100 are aligned with one another in both an X-axis direction 306 and a Y-axis direction 308 forming aligned rows and columns of coupled microphone assemblies 100. As shown in FIG. 4, the longest side of each of the assemblies 100 is oriented parallel to the X-axis direction 306, and the short side of each of the assemblies 100 is oriented parallel to the Y-axis direction 308. In other embodiments, the orientation of the assemblies 100 may be reversed. As shown in FIG. 4, the solder 106 is applied along a single axis in one pass between each pair of assemblies 100. More specifically, the solder 106 is applied along an X-axis direction 306 between adjacent microphone assemblies 100, along the longest side of each of the assemblies 100. A total of two passes of the dispensing needle 302 are shown in FIG. 4, forming a generally "U" shaped dispensing path 310. Although only two passes of the dispensing needle 302 are depicted in FIG. 4, it will be appreciated that the dispensing pattern may repeat in as many passes as needed, snaking between adjacent rows of assemblies 100, across the entirety of the PCB 300.

Figure 5:
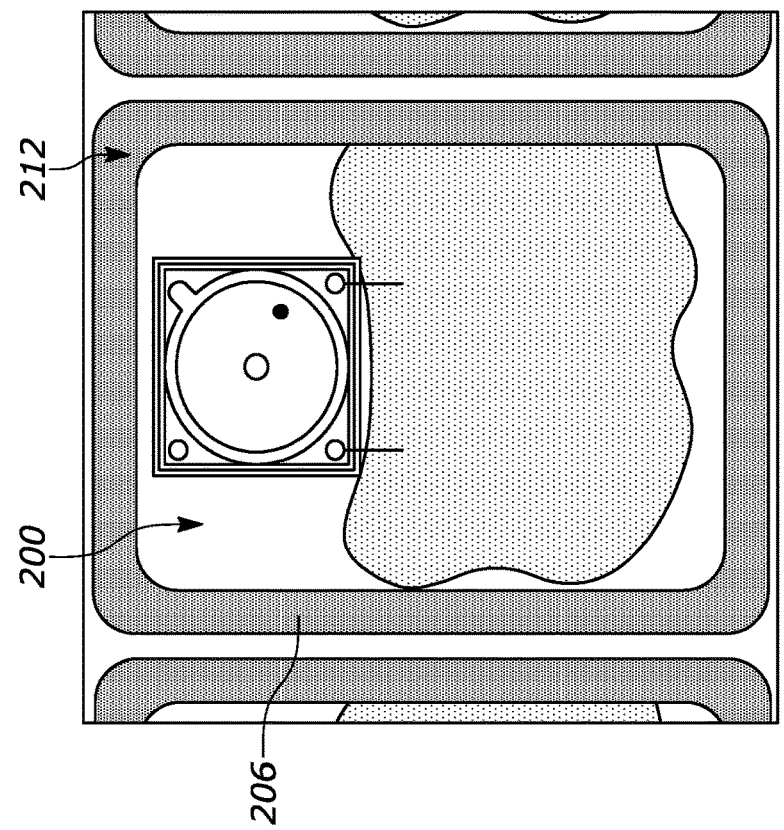
FIG. 5 is a top view of a microphone assembly on a populated PCB, according to another illustrative embodiment.

FIG. 5 shows a top view of the full frame assembly 200 after the solder 206 has been dispensed onto the PCB. As shown in FIG. 5, the solder 206 is dispensed in a rectangular-shaped ring for each full frame assembly 200. The solder 206 is applied to each full frame assembly 200 on the PCB individually (e.g., independently from other full frame assemblies 200). Due to the fixed flow rate of solder 206 through the dispensing needle 302, the amount of solder 206 applied to full frame assembly 200, along the rectangular dispensing path, is greatest in the corner regions 212, where the needle 302 moves between adjacent sides of the full frame assembly 200. In some instances, the buildup (e.g., piling) of solder 206 in the corner regions 212 can cause the solder 206 to slump or flow toward the sensitive electronic components within the full frame assembly 200. A uniform minimum clearance is required on either side of the rectangular dispensing path to prevent the needle 302 from contacting any of the electronic components mounted to the PCB. This clearance, in part, sets a maximum value of the ratio of the silicon die size to microphone package size, or DP ratio, that can be achieved during production.

Figure 6:
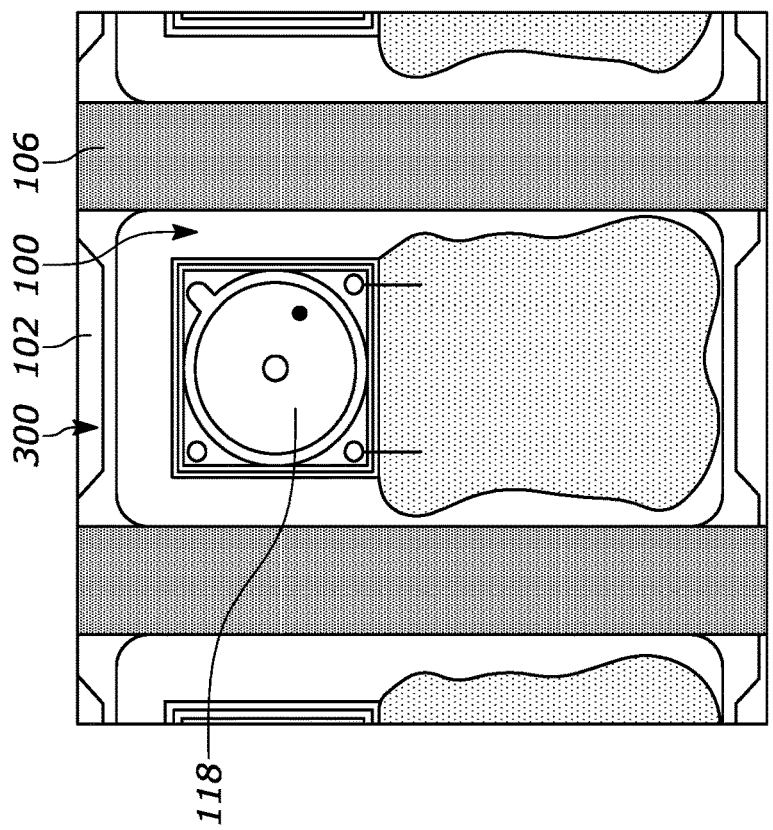
FIG. 6 is a top view of a microphone assembly on a populated PCB, according to another illustrative embodiment.

FIG. 6 shows a top view of assembly 100 after the solder 106 has been dispensed onto the PCB 300. Unlike the full frame assembly 200 of FIG. 5, the solder 106 for the assembly 100 is applied along a single axis, and in one pass between each pair of assemblies 100, which greatly reduces the amount of time required to apply the solder 106 to the PCB 300. For example, the single axis dispensing process may improve the amount of units per hour (UPH) produced by approximately a factor of 2.75 or more as compared to a dual axis dispense process used for the full frame assembly 200. A greater amount of solder is applied between the assemblies 100 to eliminate the need for multiple passes (i.e., to provide a sufficient quantity of solder 106 for each pair of assemblies 100 in a single pass on either side of each pair of assemblies 100). Among other benefits, because the dispensing needle 302 only passes along two sides of each assembly 100, the single axis dispensing technique reduces the minimum clearance requirement in the area both above and below each individual assembly 100, thereby providing additional real estate on the PCB 300 for the MEMS transducer 118 and integrated circuit 120. In some instances, the additional real estate afforded by the single line axis dispensing process can increase the DP ratio to 50% or greater.

Figure 8A:
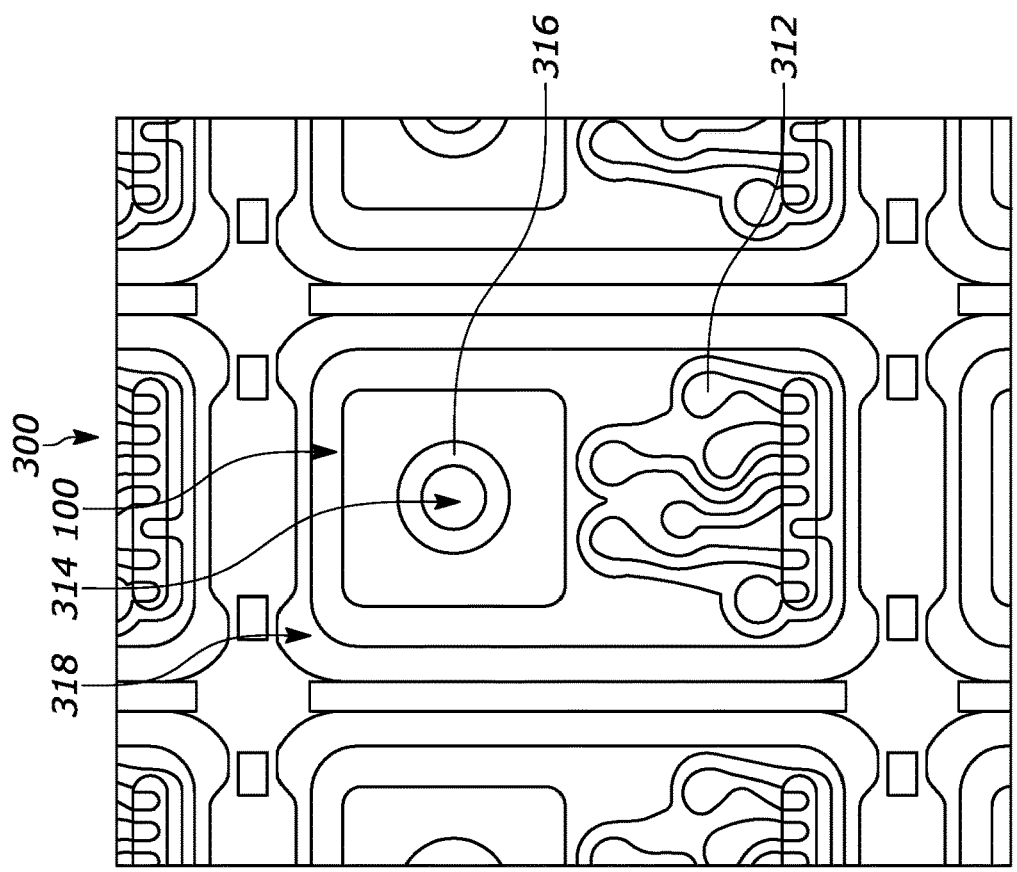
FIG. 8A is a top view of a guard ring for the microphone assembly of FIG. 6.
Figure 7:
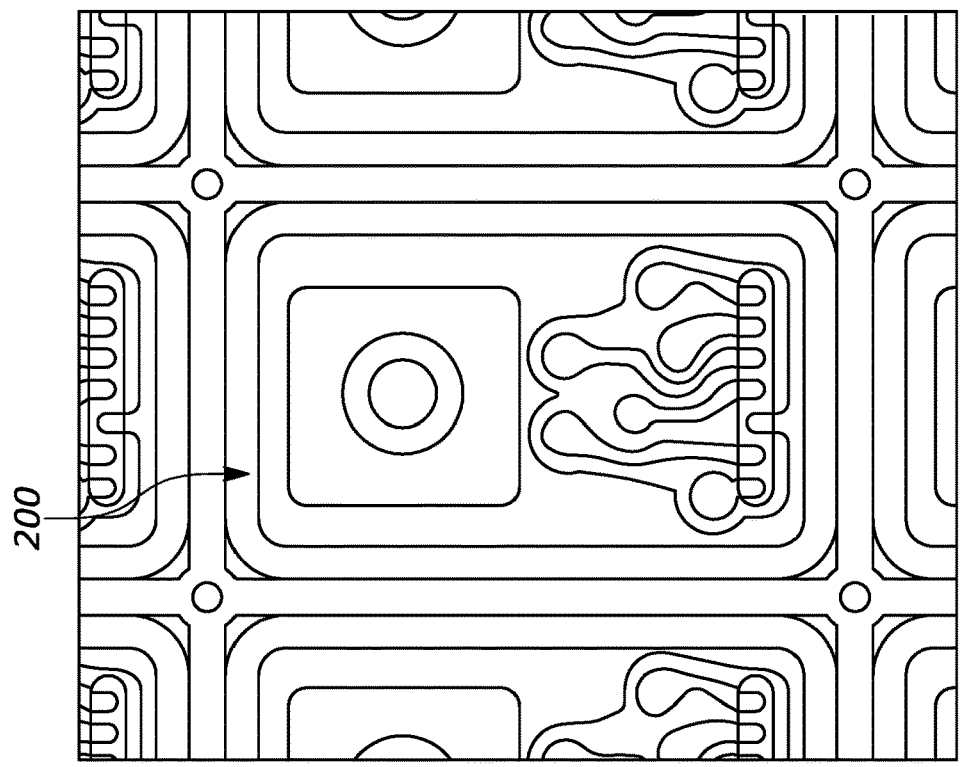
FIG. 7 is a top view of a guard ring for the microphone assembly of FIG. 5.

The solder 106 couples the can 104 to a conductive material that is embedded within or otherwise coupled to the substrate 102 (e.g., a silicon, silicon oxide, glass, Pyrex, quartz, ceramic, etc.). Referring to FIGS. 7 and 8A, the underlying PCB is shown for the full frame assembly 200 and the assembly 100, respectively. The PCB includes conductive traces surrounded by and/or embedded in non-conductive substrate material. The conductive traces may be formed in sheets, strips, or individual boards as desired. In some embodiments, the PCB includes a solder mask layer and/or a metal layer. As shown in FIG. 8A, the PCB 300 includes one or more circuit traces or pads, shown as integrated circuit traces 312; a substrate aperture, shown as port 314, that extends through the PCB 300 and provides fluid communication therethrough; a component trace or pad, shown as microphone trace 316, that is substantially annular and surrounds the port 314; and a periphery trace or pad, shown as guard ring 318. The PCB 300 may include other elements, traces or pads, and/or embedded components.

According to an exemplary embodiment, the integrated circuit traces 312 are configured (e.g., arranged, positioned, etc.) to couple the integrated circuit 120 to the PCB 300 (see also, FIG. 4). In some embodiments, the integrated circuit traces 312 are configured to receive flux and/or solder to electrically couple the integrated circuit 120 to the PCB 300. In other embodiments, the integrated circuit traces 312 include depressions or locations on the PCB 300 configured to receive adhesive and/or another coupling mechanism. The layout and/or configuration of the integrated circuit traces 312 may be different and arranged to suit the particular integrated circuit 120 employed in the MEMS device (e.g., MEMS transducer 118 of FIG. 4). By way of example, the PCB 300 may include more than or less than three integrated circuit traces 312 (e.g., one, two, four, five, etc.). In other embodiments, the PCB 300 does not include the integrated circuit traces 312.

As shown in FIG. 8A, the port 314 is a substantially round through-hole defined by (e.g., formed through, etc.) the PCB 300. The port 314 may facilitate communication (e.g., audible communication, etc.) between the MEMS transducer 118 and an environment surrounding the microphone assembly 100 (e.g., the MEMS transducer 118 receives acoustic energy through the port 314, etc.). The MEMS transducer 118 is a bottom-port MEMS device (i.e., the PCB 300 defines the port 314). In other embodiments, the port 314 has a different shape, diameter, and/or is otherwise positioned on the PCB 300. In an alternative embodiment, the MEMS transducer 118 is a top-port MEMS device (e.g., the can 104 defines the port 314, etc.).

According to an exemplary embodiment, the microphone trace 316 is configured (e.g., arranged, positioned, etc.) to couple the MEMS transducer 118 to the PCB 300. In some embodiments, the microphone trace 316 is configured to receive flux and/and solder to electrically couple the MEMS transducer 118 to the PCB 300. In other embodiments, the microphone trace 316 includes depressions or locations on the PCB 300 configured to receive adhesive and/or another coupling mechanism. The layout and/or configuration of the microphone trace 316 may be different in various illustrative embodiments and may be arranged to suit the particular MEMS transducer 118 employed in the microphone assembly 100. By way of example, the microphone trace 316 may have a different shape and/or a different diameter. In other embodiments, the PCB 300 does not include the microphone trace 316.

As shown in FIG. 8A, the guard ring 318 is embedded or otherwise coupled to the PCB 300 and substantially surrounds the integrated circuit traces 312, the port 314, and the microphone trace 316 (e.g., the guard ring 318 extends along and/or around at least a portion of the periphery of each microphone assembly 100 of the PCB 300, etc.). In some embodiments, the guard ring 318 is sunken in or recessed relative to the surface (e.g., the solder mask, etc.) of the PCB 300 (e.g., approximately twenty micrometers, etc.). The guard ring 318 may be formed as a part of the PCB 300 and/or embedded within the PCB 300. In some embodiments, the guard ring 318 is formed of (e.g., manufactured from, etc.) a metal material (e.g., copper, steel, iron, silver, gold, aluminum, titanium, etc.). In other embodiments, the guard ring 318 may be formed of another material (e.g., a thermoplastic material, a ceramic material, etc.). In some embodiments, the guard ring 318 is adhered, fused, and/or otherwise coupled to the PCB 300 without the use of solder (e.g., adhesively coupled thereto, etc.). Solder may be applied to an outward facing surface of the guard ring. In some embodiments, the outward facing surface of the guard ring includes a trace and/or is tinned.

Figure 8B:
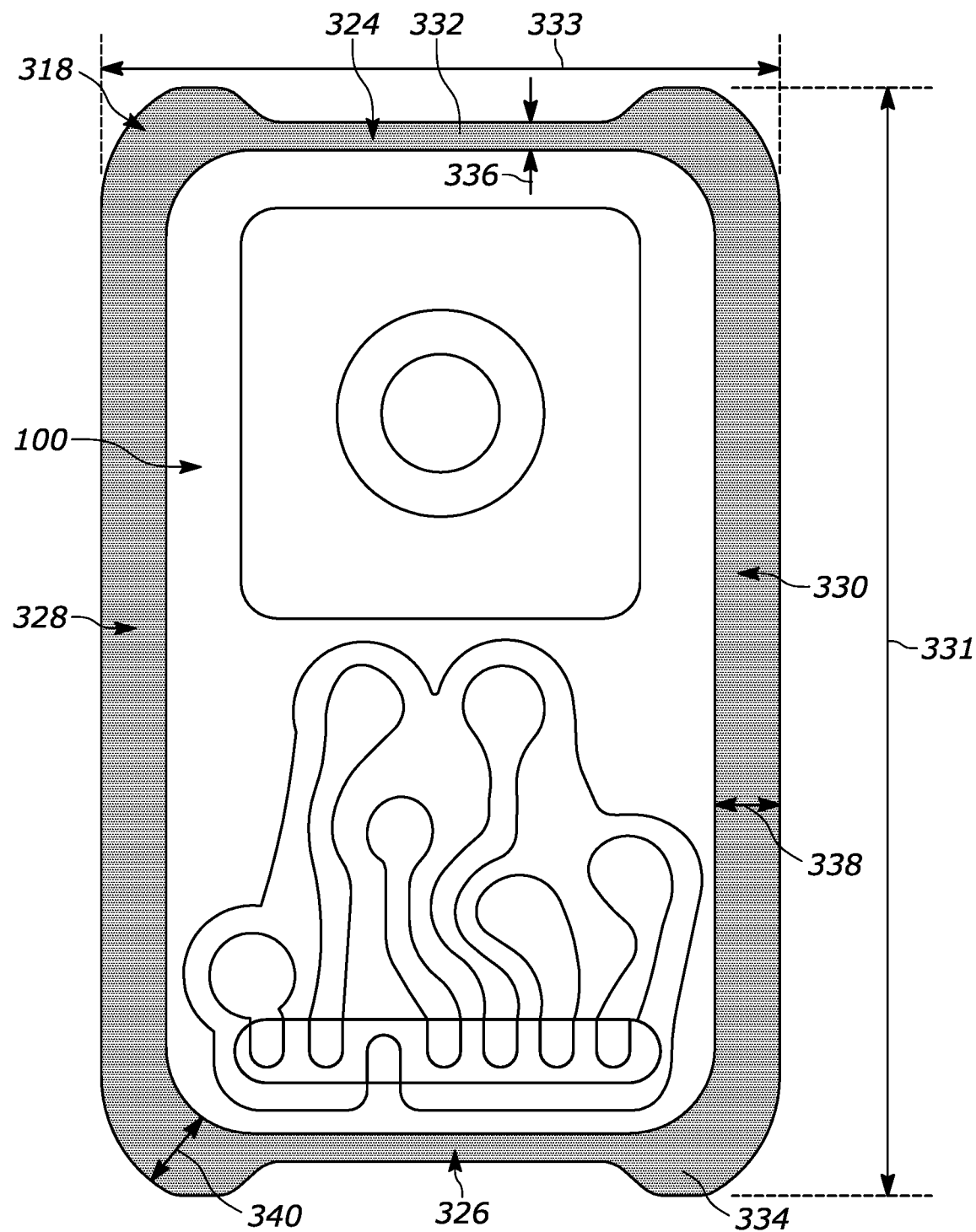
FIG. 8B is a reproduction of FIG. 8A near the guard ring.

As shown in FIG. 8B, the guard ring 318 includes a plurality of edges including a first pair of parallel edges, shown as first edge 324 and second edge 326, and a second pair of parallel edges that are adjacent to the first pair of edges (and perpendicular to the first pair of edges), shown as third edge 328 and fourth edge 330. As shown in FIG. 8B, a length 331 of the second pair of edges is greater than a length 333 of the first pair of edges. Together, the plurality of edges define a frame. The second edge 326 is disposed on an opposing side of the guard ring 318 as the first edge 324. As shown in FIG. 8B, a portion 332 (e.g., a central portion approximately half-way between the third edge 328 and the fourth edge 330) of both the first edge 324 and the second edge 326 has a reduced thickness relative to the third edge 328 and the fourth edge 330. Additionally, the portion 332 has a reduced thickness relative to each corner region 334 of the guard ring 318. Arrows are provided in FIG. 8B to indicate a thickness 336 of the portion 332, a thickness 338 of the third edge 328 and the fourth edge 330, and a thickness 340 of each corner region 334. Among other benefits, the reduced thickness of the portion 332 of the first edge 324 and the second edge 326 ensures that a minimum amount of guard ring 318 material will be visible beneath the can 104 after the solder reflow operation (e.g., after heating the PCB 300 to reflow the solder along the first edge 324 and the second edge 326, as will be further described).

Figure 9:
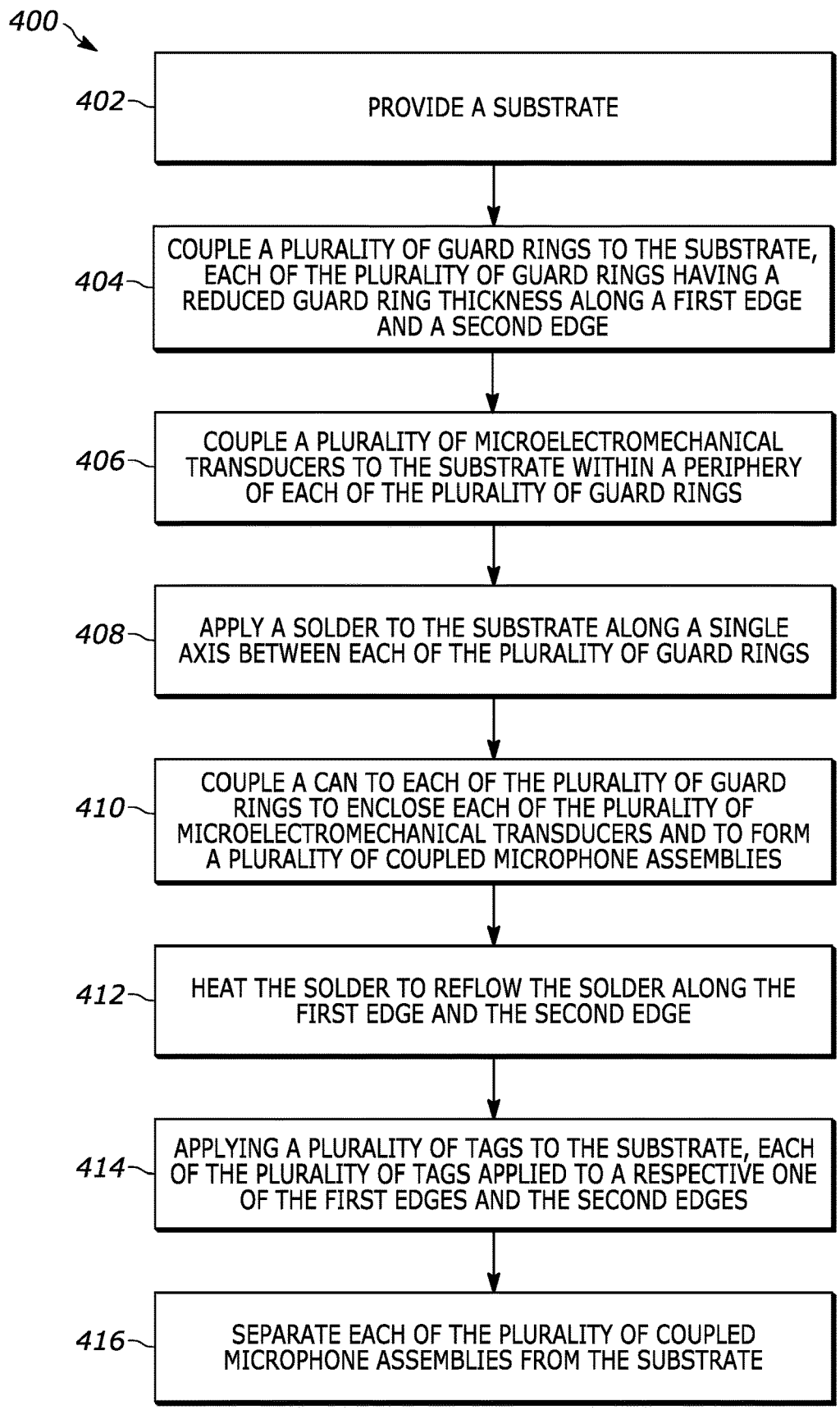
FIG. 9 is a flow diagram of a method of making a coupled microphone assembly, according to an illustrative embodiment.

Referring to FIG. 9, a method 400 of making a populated PCB is shown, according to an illustrative embodiment. Method 400 may be implemented with the assembly 100 and PCB 300 of FIG. 4. Accordingly, method 400 may be described with regards to FIGS. 1, 3, 4, 6, 8A and 8B. Additionally, various steps of the method 400 are illustrated conceptually in FIGS. 10-17.

Figure 10:
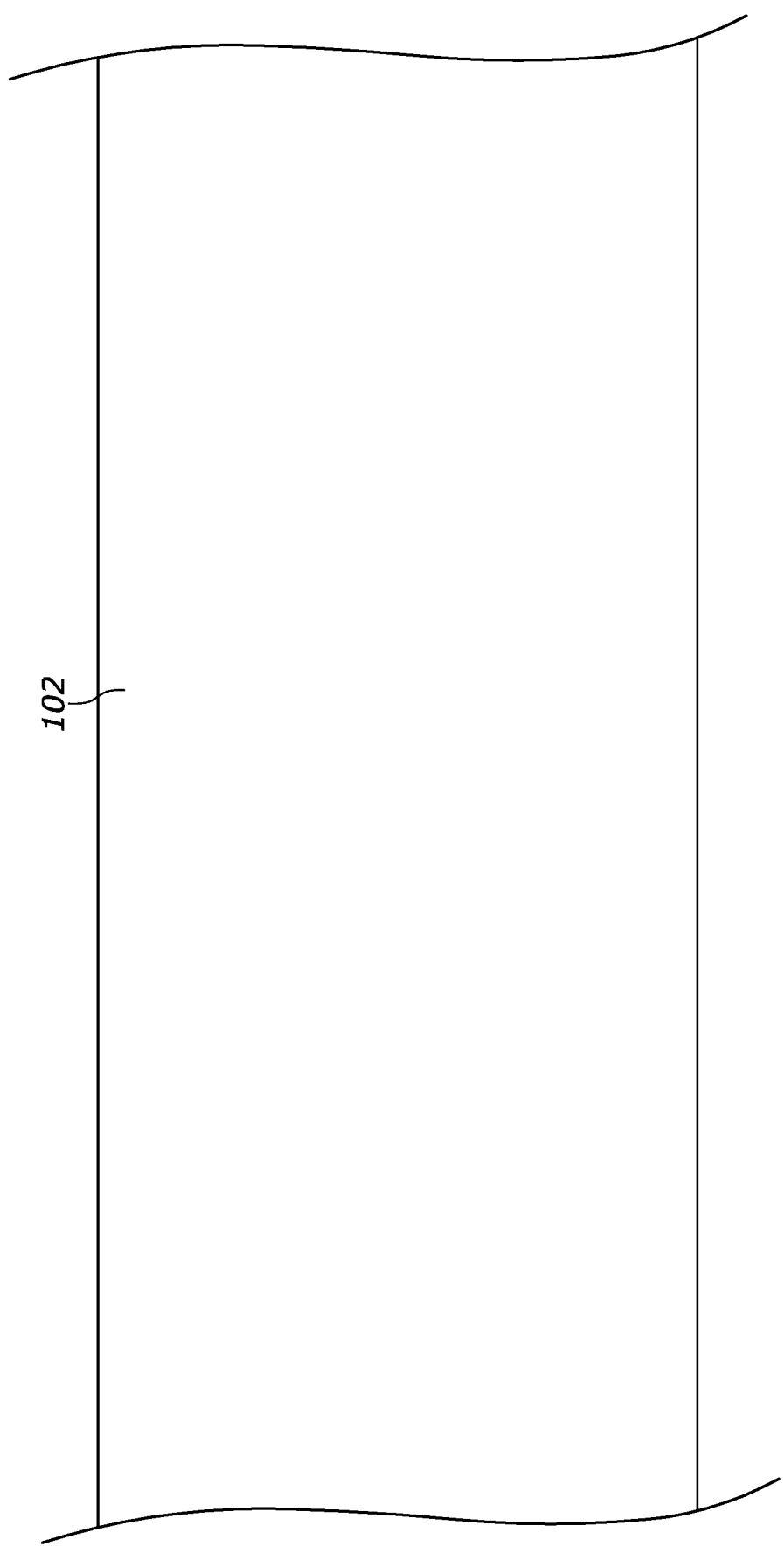
FIG. 10 is a top view of a PCB, according to an illustrative embodiment.
Figure 11:
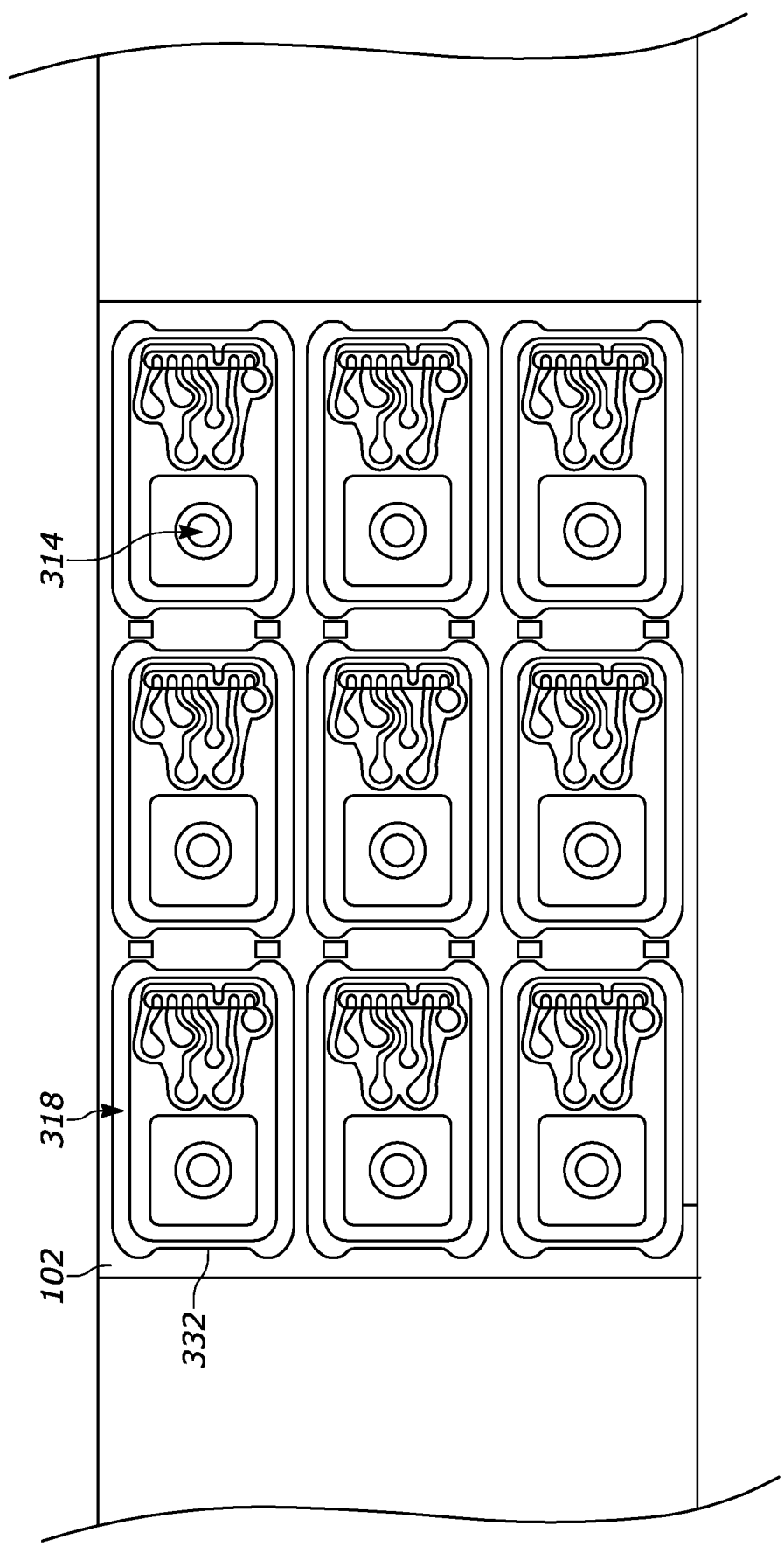
FIG. 11 is a top view of the PCB of FIG. 10 including a plurality of guard rings, according to an illustrative embodiment.

At 402, a substrate (e.g., the substrate 102, etc.) is provided (see FIG. 10). The substrate may define a plurality of ports (e.g., the ports 314, etc.). At 404, a plurality of guard rings (e.g., the guard rings 318, etc.) are coupled to the substrate (see FIG. 11). Each of the plurality of guard rings includes a portion (e.g., the portion 332, etc.) along a first edge and an opposing second edge that has a reduced thickness relative to the remaining edges. Block 404 may additionally include positioning each of the plurality of guard rings to surround a respective one of the plurality of ports and coupling each of the plurality of guard rings to the substrate with an adhesive or solder.

Figure 12:
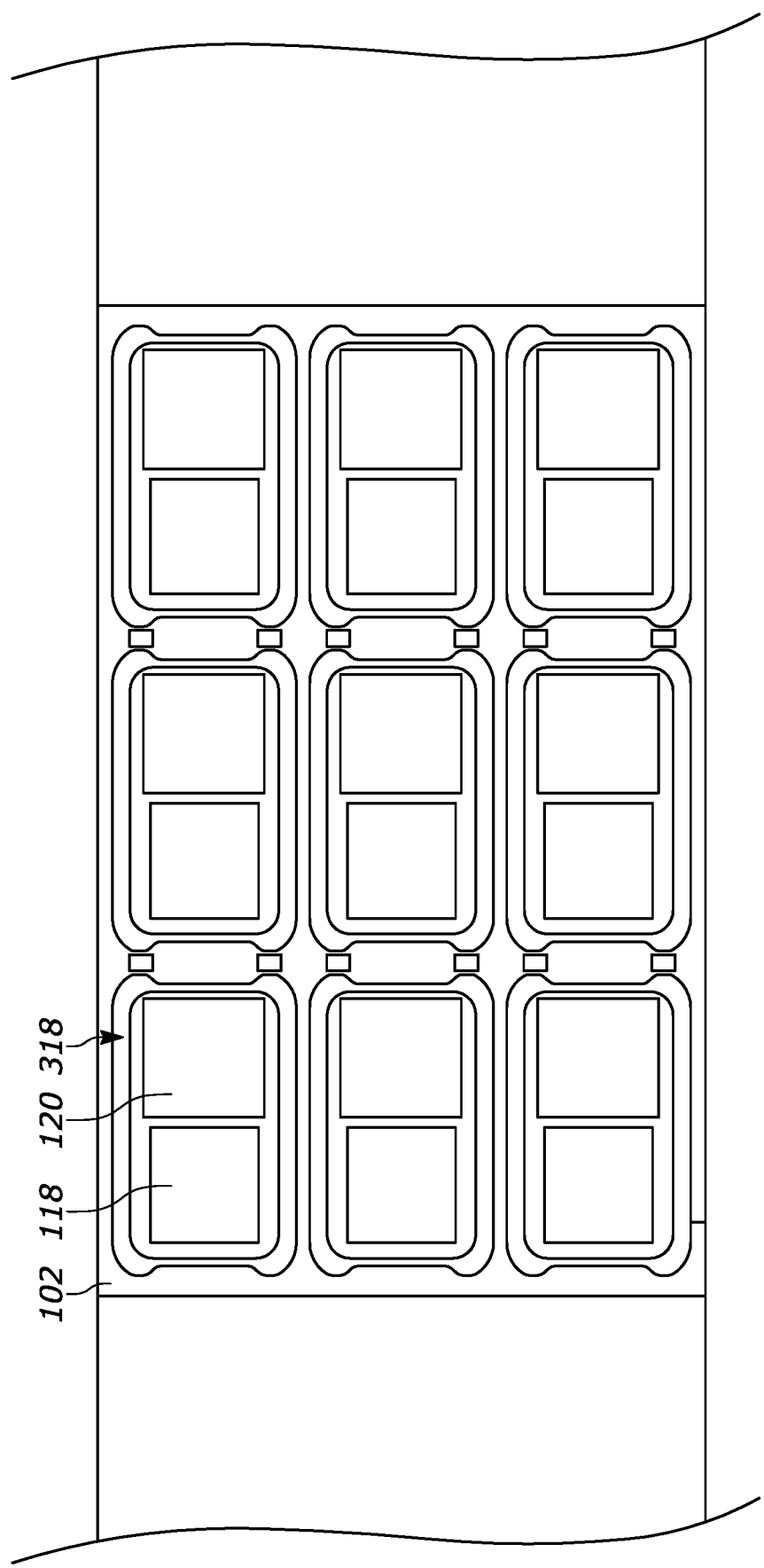
FIG. 12 is a top view of the PCB of FIG. 10 including a plurality of MEMS transducers, according to an illustrative embodiment.
Figure 13:
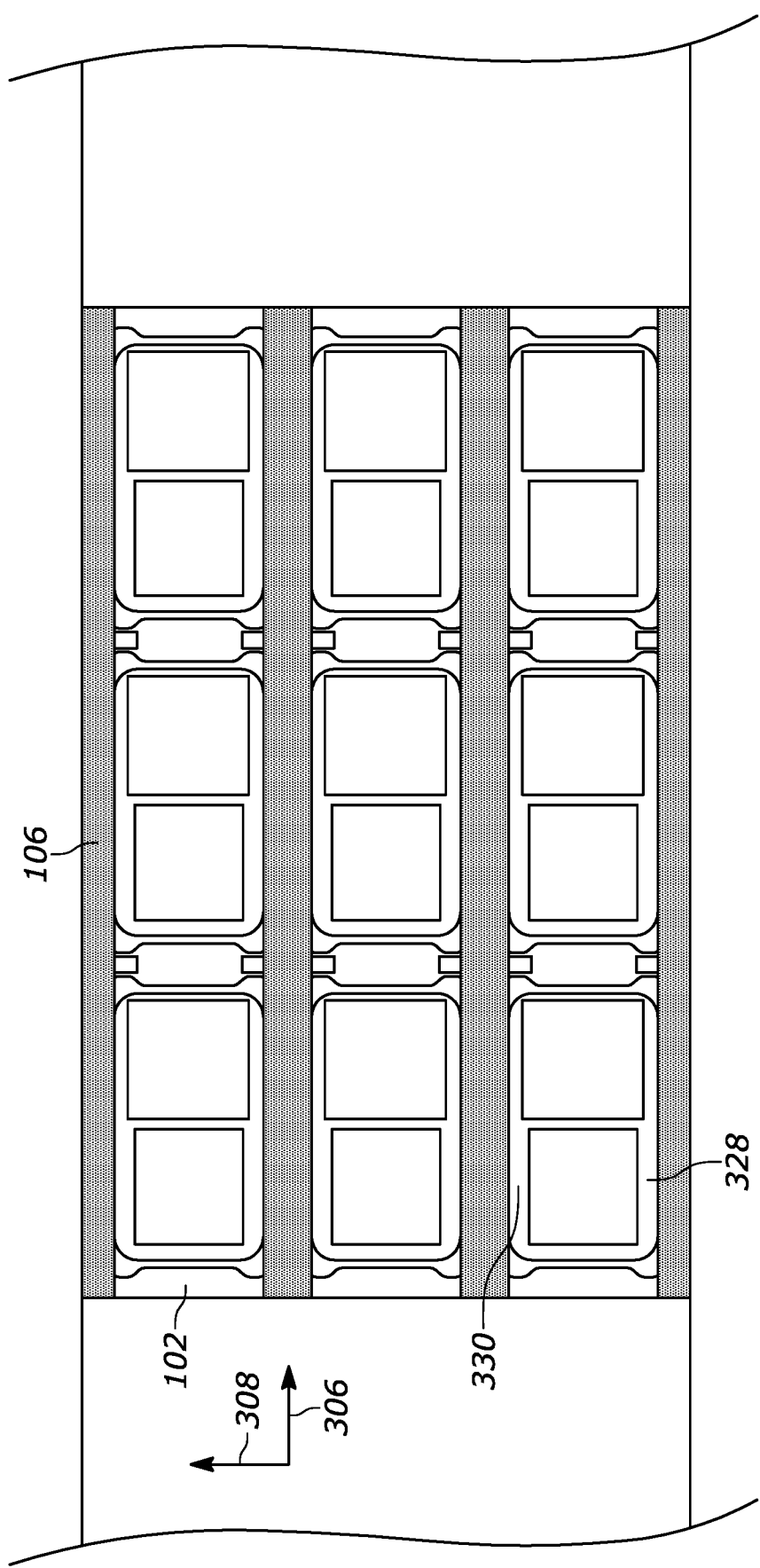
FIG. 13 is a top view of the PCB of FIG. 10 after a single axis dispense process, according to an illustrative embodiment.

At 406, a plurality of MEMS transducers (e.g., MEMS transducer 118, etc.) are coupled to the substrate within a periphery of each of the plurality of guard rings (see FIG. 12). For example, block 406 may include soldering the MEMS transducer to a microphone traces (e.g., the microphone traces 316, etc.). Block 406 may additionally include aligning each of the MEMS transducers (e.g., an opening in each of the MEMS transducers) with a respective one of the ports. In some embodiments, block 406 may further include coupling an integrated circuit (e.g., the integrated circuit 120, etc.) to the substrate (e.g., the integrated circuit traces 312, etc.) within the periphery of each of the plurality of guard rings. In some embodiments, the plurality of MEMS transducers may be coupled to the substrate before coupling the plurality of guard rings to the substrate. In other embodiments, the plurality of MEMS transducers may be coupled to the substrate after coupling the plurality of guard rings.

At 408, a solder (e.g., the solder 106, etc.) is applied to the substrate along a single axis between each of the plurality of guard rings. In the embodiment shown in FIG. 13, solder is applied to the substrate in a line along an X-axis direction (e.g., X-axis direction 306, etc.) to a second pair of edges (e.g., long edges, the third edge 328 and the fourth edge 330, etc.). The solder is applied at a location that is spaced equally from a longest edge of adjacent guard rings 318 such that an equal amount of solder is provided to each guard ring 318. Block 408 may include positioning a dispensing needle (e.g., the dispensing needle 302, etc.) above the substrate, initiating the flow of solder through the needle, and moving the needle at a continuous rate along a serpentine path between adjacent rows of guard rings.

Figure 14:
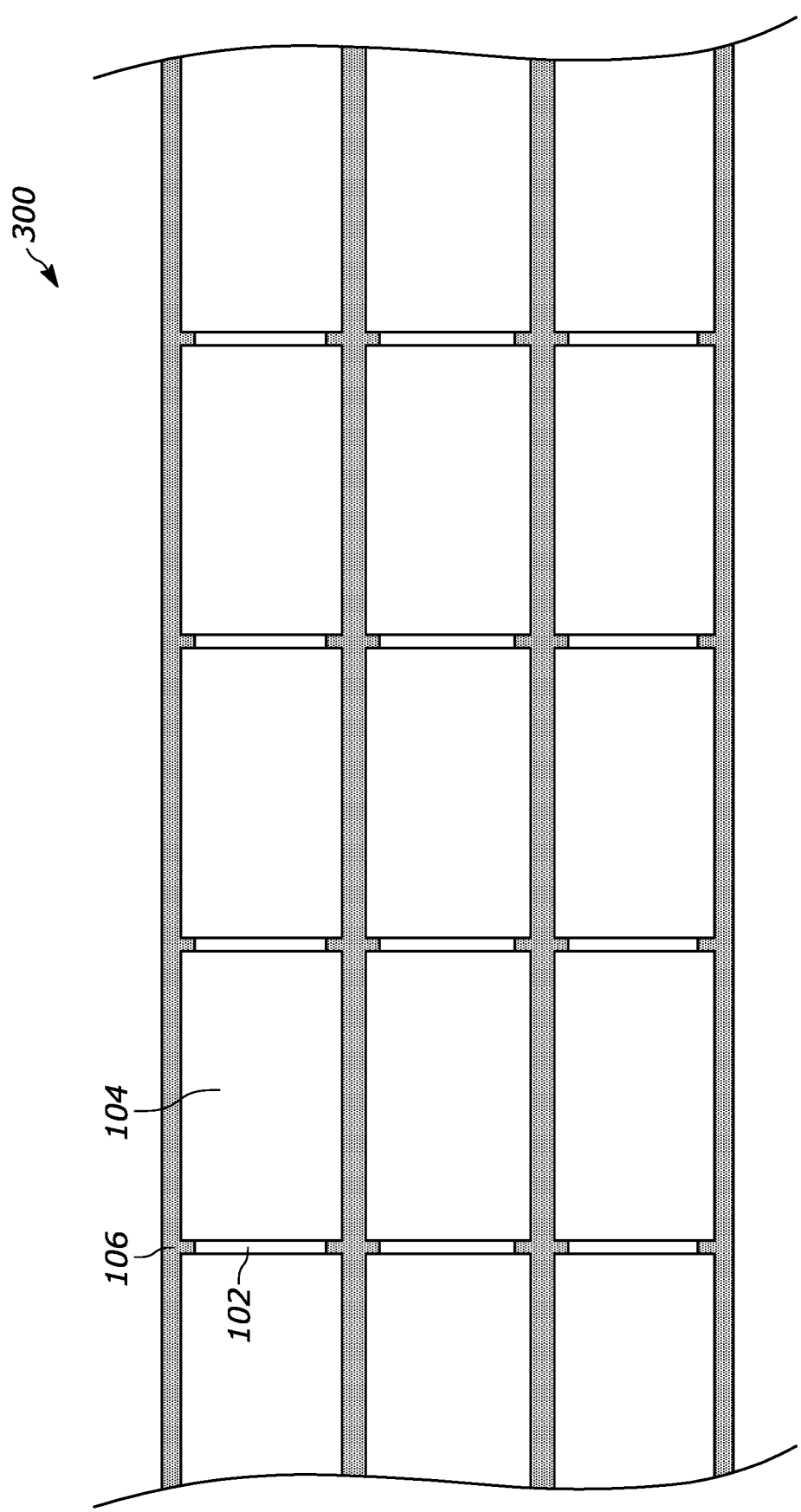
FIG. 14 is a top view of the PCB of FIG. 10 including a plurality of cans, according to an illustrative embodiment.

At 410, a can (e.g., the can 104, etc.) is coupled to each of the plurality of guard rings to enclose each of the plurality of MEMS transducers and to form a plurality of coupled microphone assemblies (see FIG. 14). Block 410 may include providing a plurality of cans and positioning each of the plurality of cans over a respective one of the plurality of MEMS transducers such that the lower edges of each of the plurality of cans is aligned with a respective one of the plurality of guard rings (e.g., such that each can covers at least a portion of a first edge and a second edge of a respective one of the plurality of guard rings). Block 410 may further include pressing each of the plurality of cans into the solder to at least partially secure the cans in position relative to the substrate.

Figure 16:
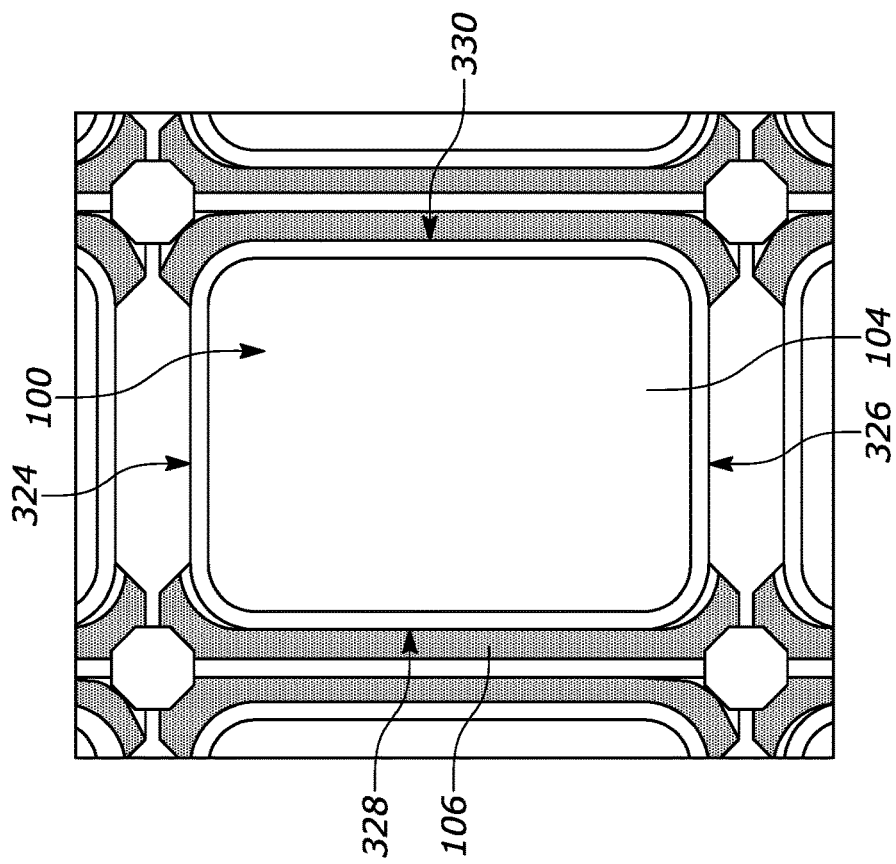
FIG. 16 is a top view of the microphone assembly of FIG. 15 after a reflow process, according to an illustrative embodiment.
Figure 15:
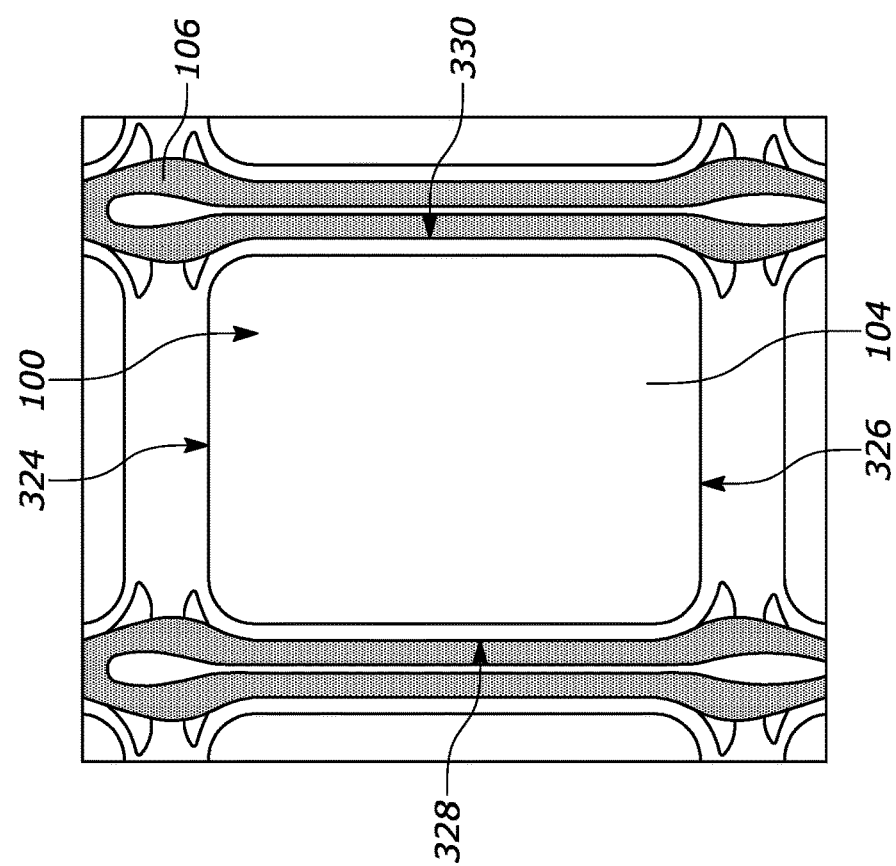
FIG. 15 is a top view of a microphone assembly before a reflow process, according to an illustrative embodiment.

At 412, heat is applied to the solder to reflow the solder along the first edge and the second edge of each of the plurality of guard rings (e.g., to reflow the solder into a gap between each of the plurality of cans and a respective one of the plurality of guard rings). Block 412 may include heating the entire populated PCB including the substrate, the MEMS transducer, the integrated circuit, the can, and/or other assembly components to a peak temperature that is just above the melting temperature of the solder. Block 412 may include dwelling at the peak temperature for a predefined period of time. For example, the populated PCB may be placed into an oven or passed beneath an infrared lamp. FIGS. 15-16 show a top view of a single coupled microphone assembly before and after the reflow process, respectively. As shown in FIG. 16, after heating, solder reflows along the first edge 324 and the second edge 326 of the guard ring. The solder along the first edge and the second edge are concealed beneath the cover due to the reduced thickness of the first edge and the second edge. In other embodiments, the solder along the first edge and the second edge may protrude a distance outwardly beyond an outer edge of the can (e.g., a distance that is less than a distance between the outer edge of the can and an outer edge of the solder along the third edge and the fourth edge).

Figure 17:
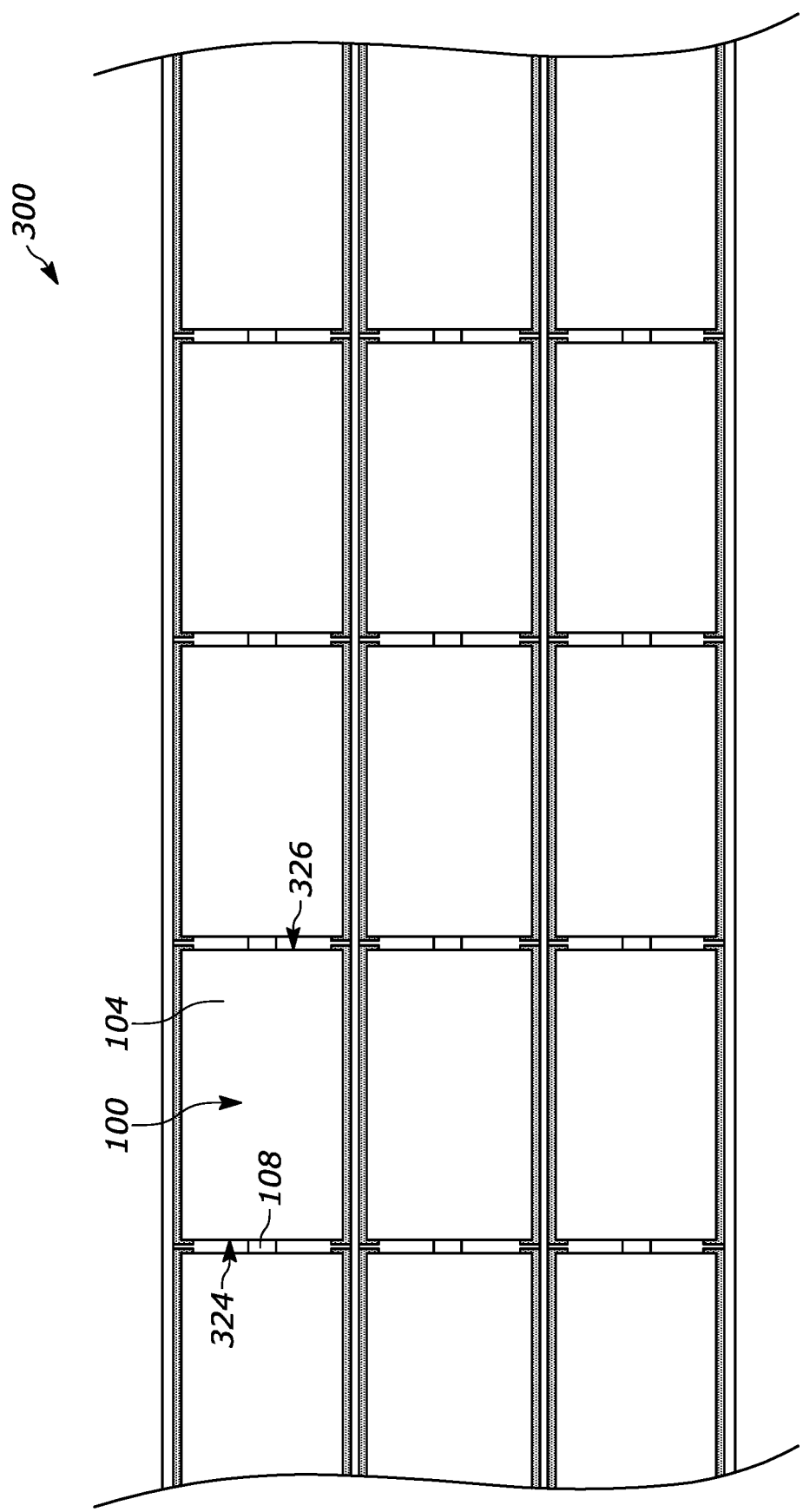
FIG. 17 is a top view of a plurality of microphone assemblies on a populated PCB, according to an illustrative embodiment.

At 414, a plurality of tags (e.g., the tags 108, etc.) are applied to the substrate. As shown in FIG. 17, each of the plurality of tags is applied to a respective one of the first edges and the second edges, and is shared between adjacent assemblies. Block 414 may include positioning a dispensing head for the tags at a central position along a respective one of the first edges and the second edges and dispensing at a predefined flow rate for a predefined period of time. Block 414 may additionally include curing the tags (e.g., dwelling for a predefined time period) to ensure that each of the tags is structurally robust. Further details regarding the application of tags to the substrate may be found in U.S. Pat. No. 10,227,232, which incorporated by reference herein in its entirety. At 416, each one of the plurality of coupled microphone assemblies is separated (e.g., singulated, diced, etc.) from the populated PCB to form a plurality of individual microphone assemblies. In some embodiments, the method 400 may further include coupling the microphone assemblies to an end-user device (e.g., a smartphone, a tablet, a laptop, etc.). In some embodiments, the method 400 may include additional, fewer, and/or different operations.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly, comprising:
   a substrate defining a port;
   a MEMS transducer coupled to the substrate such that the MEMS transducer is positioned over the port;
   a guard ring coupled to the substrate and surrounding the MEMS transducer, the guard ring comprising a plurality of edges, wherein a portion of a first edge of the plurality of edges and a portion of an opposing second edge of the plurality of edges have a reduced thickness relative to adjacent ones of the plurality of edges; and
   a can coupled to the guard ring such that the substrate and the can cooperatively define an interior cavity.

2. The microphone assembly of claim 1, wherein the can is coupled to the guard ring by solder, and wherein the solder extends along an entire length of only two edges of the plurality of edges.

3. The microphone assembly of claim 1, wherein the can is coupled to the guard ring by solder, and wherein the solder is visible along only a portion of the first edge and the second edge.

4. The microphone assembly of claim 1, wherein the plurality of edges define a frame, and wherein a thickness of the frame at each corner of the frame is greater than a thickness of the portion of the first edge and a thickness of a the portion of the second edge.

5. The microphone assembly of claim 1, wherein the can covers the first edge and the second edge such that the first edge and the second edge do not extend past an outer edge of the can.

6. The microphone assembly of claim 1, the plurality of edges further comprising a third edge and a fourth edge, wherein the third edge and the fourth edge are each substantially perpendicular to the first edge and the second edge, and wherein the third edge and the fourth edge have a greater length than the first edge and the second edge.

7. The microphone assembly of claim 1, further comprising a plurality of tags, wherein each of the plurality of tags is disposed on one of the first edge or the second edge.

8. The microphone assembly of claim 7, wherein each of the plurality of tags is disposed at a central position along one of the first edge or the second edge.

9. The microphone assembly of claim 7, wherein the can is coupled to the guard ring by a solder, and wherein each of the plurality of tags includes a material having a higher melting point than the solder.

10. A populated PCB, comprising:
    a substrate; and
    a plurality of guard rings coupled to the substrate, each of the plurality of guard rings comprising a plurality of edges, wherein a first edge of the plurality of edges and an opposing second edge of the plurality of edges have a reduced thickness relative to adjacent ones of the plurality of edges.

11. The populated PCB of claim 10, wherein the plurality of edges of each guard ring further comprise a third edge and a fourth edge, wherein the third edge and the fourth edge are each substantially perpendicular to the first edge and the second edge, and wherein the third edge and the fourth edge have a greater length than the first edge and the second edge.

12. The populated PCB of claim 10, wherein the substrate further defines a plurality of ports, wherein the populated PCB further comprises:
    a plurality of MEMS transducers coupled to the substrate, each of the plurality of MEMS transducers positioned over a respective one of the plurality of ports, wherein each of the plurality of guard rings surrounds a respective one of the plurality of MEMS transducers; and
    a plurality of cans, each of the plurality of cans coupled to a respective one of the plurality of guard rings to form an interior cavity.

13. The populated PCB of claim 12, wherein each of the plurality of cans is coupled to a respective one of the plurality of guard rings by solder, and wherein the solder for each respective one of the plurality of guard rings extends along an entire length of only two edges of the plurality of edges.

14. The populated PCB of claim 12, wherein each of the plurality of cans is coupled to a respective one of the plurality of guard rings by solder, and wherein the solder for each respective one of the plurality of guard rings extends along only an outer portion of the first edge and the second edge.

15. The populated PCB of claim 12, wherein each of the plurality of cans covers the first edge and the second edge of a respective one of the plurality of guard rings such that the first edge and the second edge do not extend past an outer edge of the can.

16. The populated PCB of claim 12, further comprising a plurality of tags, each of a first plurality of tags coupled to the first edge of a respective one of the plurality of cans, and each of a second plurality of tags coupled to the second edge of a respective one of the plurality of cans.

17. A method, comprising:
providing a substrate defining a plurality of ports;
coupling a plurality of guard rings to the substrate such that each of the plurality of guard rings is positioned to surround a respective one of the plurality of ports;
coupling a plurality of MEMS transducers to the substrate, each of the plurality of MEMS transducers to be positioned within a periphery of a respective one of the plurality of guard rings and at least partially isolating a respective one of the plurality of ports;
applying a solder along a single axis between each of the plurality of guard rings such that the solder is applied approximately equally to adjacent ones of the plurality of guard rings;
coupling a plurality of cans to the plurality of guard rings to form a plurality of coupled microphone assemblies, each of the plurality of cans configured to enclose a respective one of the plurality of MEMS transducers; and
separating each of the plurality of coupled microphone assemblies from the substrate to form a plurality of individual microphone assemblies.

18. The method of claim 17, wherein each of the plurality of guard rings comprises a plurality of edges defining a frame, and wherein a first edge of the plurality of edges and an opposing second edge of the plurality of edges has a reduced thickness relative to adjacent ones of the plurality of edges.

19. The method of claim 17, further comprising heating the solder to reflow the solder along a portion of a first edge of each one of the plurality of guard rings and a portion of an opposing second edge of each one of the plurality of guard rings, wherein the first edge and the second edge extend in a direction that is substantially perpendicular to the single axis.

20. The method of claim 19, further comprising applying a plurality of tags to the substrate, each of the plurality of tags applied to a respective one of the first edges and the second edges.

* * * * *